Figure 1:
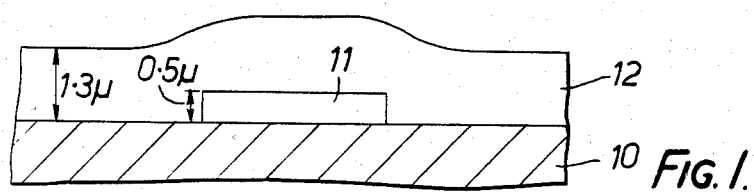

United States Patent [19]

Rhodes

[11] Patent Number: 4,536,249
[45] Date of Patent: Aug. 20, 1985

[54] INTEGRATED CIRCUIT PROCESSING METHODS

[75] Inventor: Stephen J. Rhodes, Northampton, England

[73] Assignee: Plessey Overseas Limited, Illford, England

[21] Appl. No.: 597,426

[22] Filed: Apr. 6, 1984

[30] Foreign Application Priority Data

Apr. 6, 1983 [GB] United Kingdom ............... 8309341

[51] Int. Cl.³ ................ B44C 1/22; C03C 15/00; C03C 25/06; C23F 1/02
[52] U.S. Cl. .................... 156/643; 156/644; 156/646; 156/652; 156/653; 156/655; 156/656; 156/661.1; 156/668; 204/192 E; 357/71; 427/89; 430/313; 430/315; 430/317; 430/318
[58] Field of Search ............. 156/643, 646, 650–653, 156/655–661.1, 668, 644; 204/164, 192 E; 427/38, 39, 88–91; 357/65, 71; 430/311–318; 29/580, 591

[56] References Cited

U.S. PATENT DOCUMENTS

| 3,816,196 | 6/1974 | LaCombe ...................... 156/668 X |
| 4,070,501 | 1/1978 | Corbin et al. .................. 156/652 X |
| 4,184,909 | 1/1980 | Chang et al. ...................... 156/643 |
| 4,317,700 | 3/1982 | Tanaka et al. .............. 156/661.1 X |
| 4,367,119 | 1/1983 | Logan et al. ................... 156/644 X |
| 4,409,319 | 10/1983 | Colacino et al. .............. 156/644 X |

Primary Examiner—William A. Powell
Attorney, Agent, or Firm—Fleit, Jacobson, Cohn & Price

[57] ABSTRACT

An integrated circuit processing method comprises the formation on a substrate of a metallized conductor pattern. A layer of insulating material is formed over the conductor pattern and a mask is superimposed thereon. The mask is resistant to plasma etching and is provided at predetermined positions with apertures defining required void outlines. Plasma etching through the mask forms vias in the insulating layer which communicate with the metallized conductor pattern. The mask is removed to leave the integrated circuit with communicating vias which enable connection to the conductor pattern.

11 Claims, 5 Drawing Figures

INTEGRATED CIRCUIT PROCESSING METHODS

This invention relates to integrated circuit processing methods and more particularly to a method of providing voids in an integrated circuit structure which communicate with a buried conductor pattern. The invention has special application to the interconnection of multi-level metallisations in integrated circuit structures.

Polyimide is widely used as an insulator between levels of metallisation in integrated circuits. A hole or via has to be formed to provide a connection between the levels of interconnect. One method known to us for achieving this is to use a thick resist as a mask, where the thickness of the resist is substantially greater than the thickness of the polyimide. After resist development, the cured polyimide is etched in an oxygen plasma, and since the etch rates of the resist and polyimide are similar, the polyimide is cleared before the resist. The resist can then be removed leaving a clean smooth surface of polyimide in the field regions.

There are two main drawbacks when using this technique. Firstly, since a thick resist must be used, resolution of the via is limited due to poorer definition in thicker resists. Secondly, as the resist edge is bevelled after development and the resist is laterally etched during the etching process, the via feature becomes enlarged, particularly when large amounts of overetch are required due to changes in underlying topography. Both of these problems limit the ultimate via size to about 4 micron.

Another method we have employed for cutting vias in polyimide uses wet etching. This can be achieved either by using hydrazine when the polyimide is cured or less hazardous etches when the polyimide is uncured or partially cured. This latter technique is sensitive to curing temperature and also creates sloped via sides which gives via enlargement during overetch.

This invention seeks to provide a method which enables improved resolution of the via.

According to the invention there is provided an integrated circuit processing method, comprising the steps of providing on a substrate a metallised conductor pattern, forming a layer of an insulating material over the conductor pattern, superimposing on the layer of insulating material a mask which is resistant to plasma etching, which mask is provided at predetermined positions with apertures defining required void outlines, plasma etching through the mask to form vias in the insulating layer communicating with the metallised conductor pattern and removing the mask. By plasma etching through a durable or non erodible mask, only a slight amount of via enlargement occurs.

The insulating layer may be applied by spinning and may be polyimide.

The method may include the subsequent step of depositing onto the insulating layer a second level metallised conductor pattern which communicates with the first conductor pattern via the voids.

The method may include the subsequent steps of similarly forming one or more additional insulating layers with voids and conductor patterns which communicate via the voids with one or more of the other level metallised conductor patterns.

The mask(s) may be formed by coating the insulating layer with a parting layer, of a material which is soluble in a solvent which does not damage the insulating layer or conductor pattern, depositing a layer of a material which is resistant to plasma etching and forming apertures in the dual layer mask by photo engraving and the mask may be removed after formation of the vias, by exposure to a solvent for the parting layer. The parting layer may be a polymer or a photoresist. A suitable solvent is acetone.

The mask(s) may be formed from metal e.g. aluminium and may be deposited by sputtering.

In order that the invention and its various other preferred features may be understood more easily, embodiments thereof will now be described, by way of example only, with reference to the drawings wherein:

FIGS. 1 to 5 are schematic cross sectional views showing five stages in the production of a two level metal integrated circuit in accordance with the invention. Only a part of the complete circuit relating to a single via is shown.

FIG. 1 shows an integrated circuit substrate 10 onto which a first level of metallisation has been deposited and photo-lithographically etched to produce a conductor pattern. One element 11 of the first level conductor pattern is shown. A layer 12 of polyimide is now provided over the substrate and metallisation by spinning using conventional equipment such as is employed for application of photoresist. The polyimide is then cured.

Figure 2:
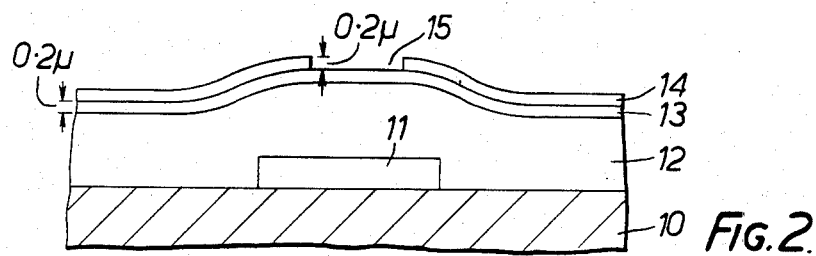

Referring now to FIG. 2, a thin layer 13 of a polymer is spun onto the polyimide surface. In practice we employ a thinned photoresist although its photosensitive properties are not used. A layer 14 of a material which is resistant to plasma etching e.g. a metal such as aluminium is now deposited on the layer 13 by for example sputtering. The layer 14 is now photo-engraved in a conventional manner using a suitable high definition resist process and apertures 15 are etched through the layer by wet chemistry or by a plasma etch technique. The parting layer 13 and the insulating layer 12 are now etched through the aperture 15 in an oxygen plasma to form a via 16 which communicates with the first metallisation layer 11. The masking layer 14 is not affected by this etching process but the photoresist used to define the aperture 15 is removed.

Figure 4:
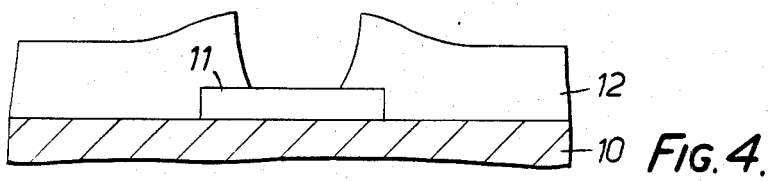

The integrated circuit is now immersed in a suitable solvent for the parting layer 13 e.g. acetone if resist is used and this permits the masking layer to float off. The device is then as illustrated in FIG. 4.

Figure 5:
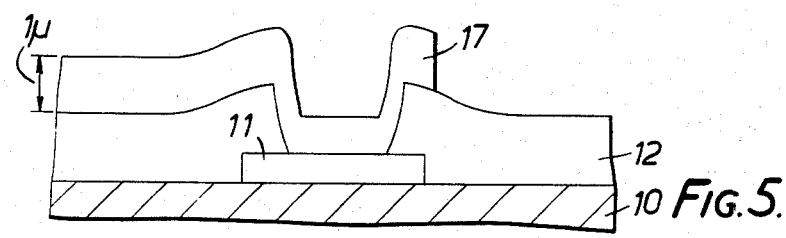

A second level conductor pattern is now defined on the surface of the layer 12 by convention photo-lithographic techniques and metal conductors 17 are deposited. The metal deposition extends into the voids and forms an electrical connection with the first level metallisation 11 as is shown in FIG. 5.

Figure 3:
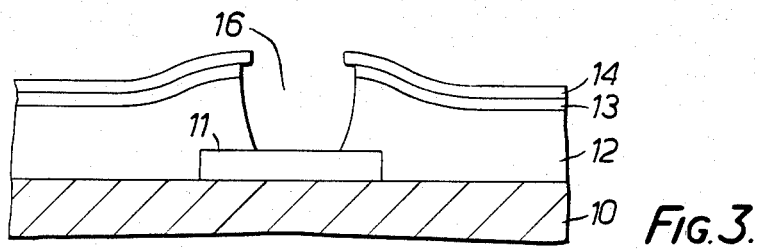

A particular advantage of the previously described technique can be explained with reference to FIG. 3. When plasma etching is effected through the durable layer 14 a re-entrant profile is formed. Such a profile, if provided in the insulating layer itself, would have in effect an undercut near its surface and, due to shading effects, might not be coated during the second metallisation process. This can lead to an open circuit between the metallisations. By employing a parting layer 13 which is not durable to the plasma etch the re-entrant part of the profile is formed in the layer 13, as can be seen in FIG. 3, and is subsequently removed when the masking material is floated off. This is of particular advantage in that the voids produced have a particularly suitable edge profile in that they are slightly inwardly tapered and are easily coated.

The use of a parting layer which is chemically removed enables the mask to be removed without damage to the first level metallisation as exposed within the via.

Although in the described method the polyimide layer 12 is cured, the technique is also applicable with uncured or partially cured polyimide layers.

Although the layer 14 in the method described is aluminium alternative materials that can be applied by low temperature deposition can be employed provided they are resistant to etching in oxygen plasma e.g. oxides, nitrides.

Although the embodiment described is a two layer metallisation device it will be appreciated that the same method is applicable to multi-level metallisation and one or more additional insulating layers similar to layer 12 can be provided with voids and conductor patterns which communicate via the voids with one or more of the other level metallised conductor patterns.

The present invention is applicable to the provision of vias down to 1.5 micron and accordingly reduced pitch spacing of vias as possible with corresponding increase in metallisation packing density which in turn leads to improved overall integrated circuit packing density, improved circuit performance and reduced cost.

The method is suitable for use in both CMOS and bipolar technology and is particularly advantageous in construction of uncommitted logic gate arrays.

I claim:

1. An integrated circuit processing method, comprising the steps of: providing on a substrate a first metallised conductor pattern, forming a layer of an insulating material over the first conductor pattern, coating the insulating layer with a parting layer of a material which is soluble in a solvent which does not damage the insulating layer or the conductor pattern, depositing over the parting layer a masking layer which is resistant to plasma etching, forming apertures in the masking layer at predetermined positions to define required via outlines, plasma etching through the masking layer to form vias in the insulating layer communicating with the first metallised conductor pattern, removing the masking layer by exposing the parting layer to the solvent, and forming onto the insulating layer a second level metallised conductor pattern to communicate with the first conductor pattern in the via.

2. A method as claimed in claim 1, wherein the insulating layer is polyimide.

3. A method as claimed in claim 2, wherein the insulating layer is applied by spinning.

4. A method as claimed in claim 1, wherein the apertures are formed in the masking layer by photo engraving.

5. A method as claimed in claim 1, comprising the subsequent steps of: similarly forming one or more additional insulating layers with vias and conductor patterns which communicate via the voids with one or more of the other level metallised conductor patterns.

6. A method as claimed in claim 1, wherein the parting layer is a polymer.

7. A method as claimed in claim 1, wherein the parting layer is a photoresist.

8. A method as claimed in claim 7, wherein the solvent is acetone.

9. A method as claimed in claim 1, wherein the masking layer is formed from a metal.

10. A method as claimed in claim 9, wherein the metal is aluminum.

11. A method as claimed in claim 10, wherein the metal layer is deposited by sputtering.

* * * * *